(12) United States Patent
Hsu

(10) Patent No.: US 7,126,825 B2
(45) Date of Patent: Oct. 24, 2006

(54) COMBINED CHIP/HEAT-DISSIPATING METAL PLATE AND METHOD FOR MANUFACTURING THE SAME

(75) Inventor: Chih-Ming Hsu, Lujhu Township, Taoyuan County (TW)

(73) Assignee: Cleavage Enterprise Co., Ltd., Taoyuan County (TW)

( * ) Notice: Subject to any disclaimer, the term of this patent is extended or adjusted under 35 U.S.C. 154(b) by 76 days.

(21) Appl. No.: 11/007,376

(22) Filed: Dec. 7, 2004

(65) Prior Publication Data

US 2006/0120052 A1 Jun. 8, 2006

(51) Int. Cl.
*H05K 7/20* (2006.01)

(52) U.S. Cl. ............... 361/704; 361/702; 361/707; 361/709; 361/711; 29/592.1; 29/825; 29/832; 29/835; 29/844; 29/861; 165/80.3; 165/185; 257/706; 257/707; 438/15; 438/458

(58) Field of Classification Search .......... 361/704, 361/705, 706, 707, 709, 711, 712; 165/80.3, 165/80.4, 165, 185; 257/706–712, 716–726; 438/15, 458, 459, 460, 464, 462, 977, 118; 437/101, 233; 451/69, 285, 287, 289, 65
See application file for complete search history.

(56) References Cited

U.S. PATENT DOCUMENTS 5,268,065 A * 12/1993 Grupen-Shemansky ..... 438/118
5,563,092 A * 10/1996 Ohmi ......................... 438/485
6,303,471 B1 * 10/2001 Unno et al. ................. 438/464
6,827,636 B1 * 12/2004 Yamada ........................ 451/65
2004/0029938 A1 * 2/2004 Buchan ....................... 514/369
2004/0235269 A1 * 11/2004 Kitamura et al. ........... 438/460
2005/0074921 A1 * 4/2005 Yamagata ................... 438/118

FOREIGN PATENT DOCUMENTS

| JP | 359154037 A | * | 9/1984 |
| JP | 407106638 A | * | 4/1995 |
| JP | 08316113 A | * | 11/1996 |
| JP | 2002064169 A | * | 2/2002 |

* cited by examiner

Primary Examiner—Michael Datskovskiy
(74) Attorney, Agent, or Firm—Pro-Techtor Int'l Services

(57) ABSTRACT

A combined chip/heat-dissipating metal plate includes a chip and a heat-dissipating metal plate bonded to a side of the chip, wherein the heat-dissipating metal plate is in a stretched state. The heat-dissipating metal plate is stretched before bonding the chip. Preferably, the stretched heat-dissipating metal plate has a thickness smaller than that of the heat-dissipating metal plate before stretching by not more than 20%. The chip has good compression strength in the radial direction and the heat-dissipating metal plate has higher tensile strength after being stretched and taking shape, providing a more stable structure and avoiding damage to the chip due to radially outward tension. The combined chip/heat-dissipating metal plate thus obtained is more stable and thus benefits the subsequent cutting by a laser cutting apparatus.

2 Claims, 7 Drawing Sheets

COMBINED CHIP/HEAT-DISSIPATING METAL PLATE AND METHOD FOR MANUFACTURING THE SAME

BACKGROUND OF THE INVENTION

1. Field of the Invention

The present invention relates to a combined chip/heat-dissipating metal plate. In particular, the present invention relates to a combined chip/heat-dissipating metal plate providing a heat-dissipating effect when the chip is cut by a laser cutting device. The present invention also relates to a method for manufacturing the chip/heat-dissipating metal plate.

2. Description of the Related Art

In current procedures for manufacturing light-emitting diodes (LEDs) and memories, numerous densely arrayed crystallite units are produced on a chip, and a laser cutting apparatus is used to cut the crystalline units into numerous crystallites. A typical chip includes an electrode layer, an epilayer (or epitaxy layer), and a gem layer. Before the laser cutting procedure, as show in FIG. 1, a chip 10 is adhered on a central area of an upper face of a see-through plastic film 12 placed on a working table of a laser cutting apparatus, with a metal supporting ring 13 adhered to a perimeter of the plastic film 12. An electronic microcamera is mounted above the working table for observing the arrangement and location of each crystallite unit in the epilayer of the chip 10. The chip is cut by a laser beam from top to obtain individual crystallites.

To improve the heat-dissipating effect for a chip for high-performance, high-brightness LEDs or high-frequency memories, it is well known to adhere a heat-dissipating metal plate 11 to a side of the chip 10, as shown in FIG. 2. A plurality of tiny balls are provided on the side of the chip 10 or adhesive is applied to the side of the chip 10. Next, the chip 10 and the heat-dissipating metal plate 11 are bonded together by applying pressure and heat.

The chip 10 is made of gallium nitride, gallium arsenide, or silicon and has a thickness smaller than 0.1 mm. Such a chip has high compression strength and poor tension strength in the radial direction. The heat-dissipating metal plate 11 is made of copper or aluminum and has a thickness smaller than 0.15 mm. When the heat-dissipating metal plate 11 is stretched, the thickness reduces. However, the heat-dissipating metal plate 11 has poor compression strength in the radial direction. When the combined chip/heat-dissipating metal plate is subjected to a tensile force, the chip 10 is damaged, although the heat-dissipating metal plate 11 may withstand the tensile force. The combined chip/heat-dissipating metal plate is unstable and thus may adversely affect the subsequent cutting.

SUMMARY OF THE INVENTION

An objective of the present invention is to provide a combined chip/heat-dissipating metal plate with improved tensile strength and improved compression strength while providing a heat-dissipating effect.

Another objective of the present invention is to provide a method for manufacturing the chip/heat-dissipating metal plate.

In accordance with an aspect of the invention, a combined chip/heat-dissipating metal plate comprises a chip and a heat-dissipating metal plate bonded to a side of the chip, wherein the heat-dissipating metal plate is in a stretched state.

Preferably, the stretched heat-dissipating metal plate has a thickness smaller than that of the heat-dissipating metal plate before stretching by not more than 20%.

In accordance with another aspect of the present invention, a method for manufacturing a combined chip/heat-dissipating metal plate comprises stretching a heat-dissipating metal plate along a radially outward direction of the heat-dissipating metal plate and bonding a chip to a side of the heat-dissipating metal plate in a stretched state, forming a combined chip/heat-dissipating metal plate with the heat-dissipating metal plate in the stretched state.

Other objectives, advantages, and novel features of the invention will become more apparent from the following detailed description when taken in conjunction with the accompanying drawings.

DETAILED DESCRIPTION OF THE PREFERRED EMBODIMENTS

Figure 1:
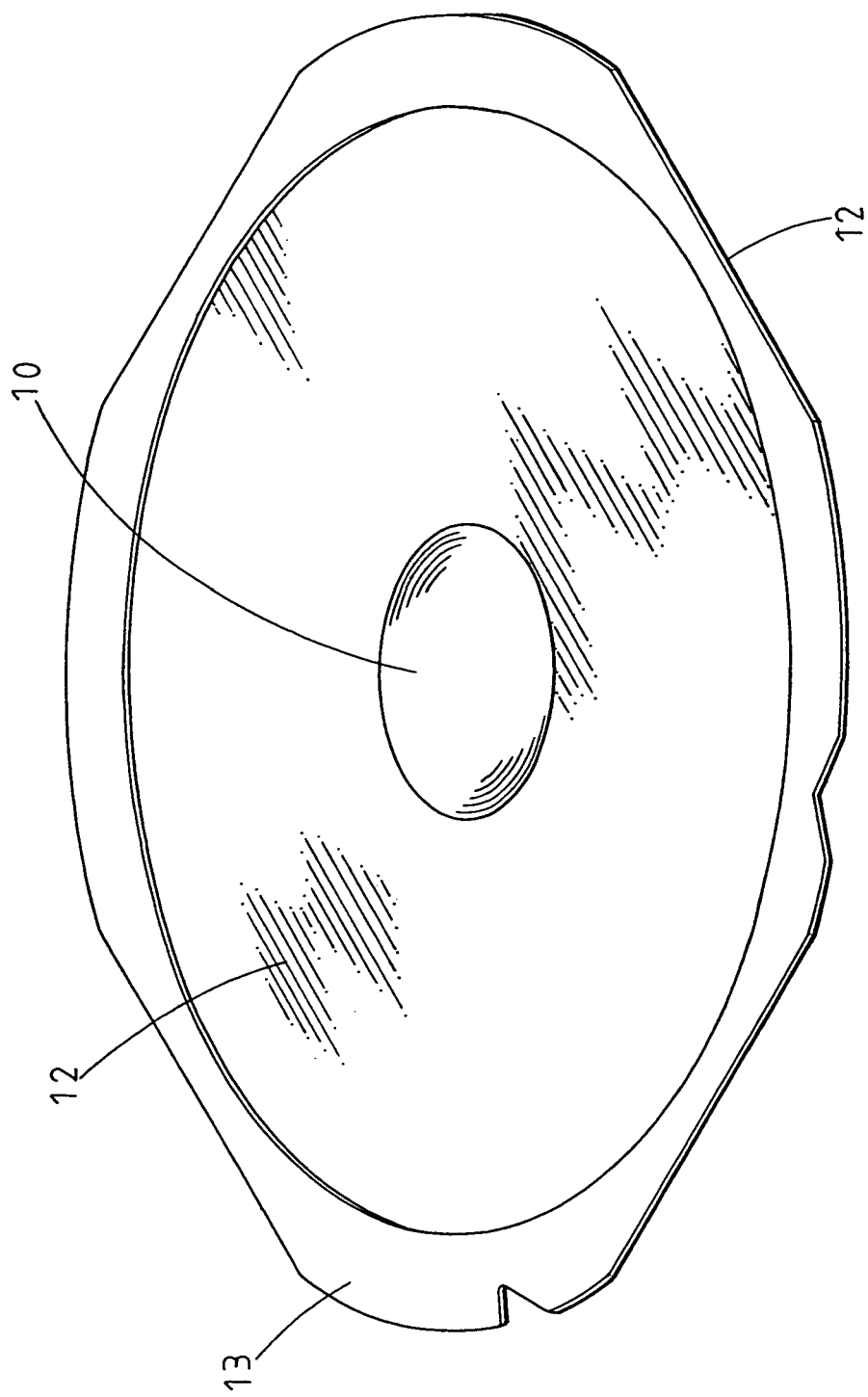
FIG. 1 is a perspective view of a chip, a supporting ring, and a plastic film according to prior art.
Figure 2:
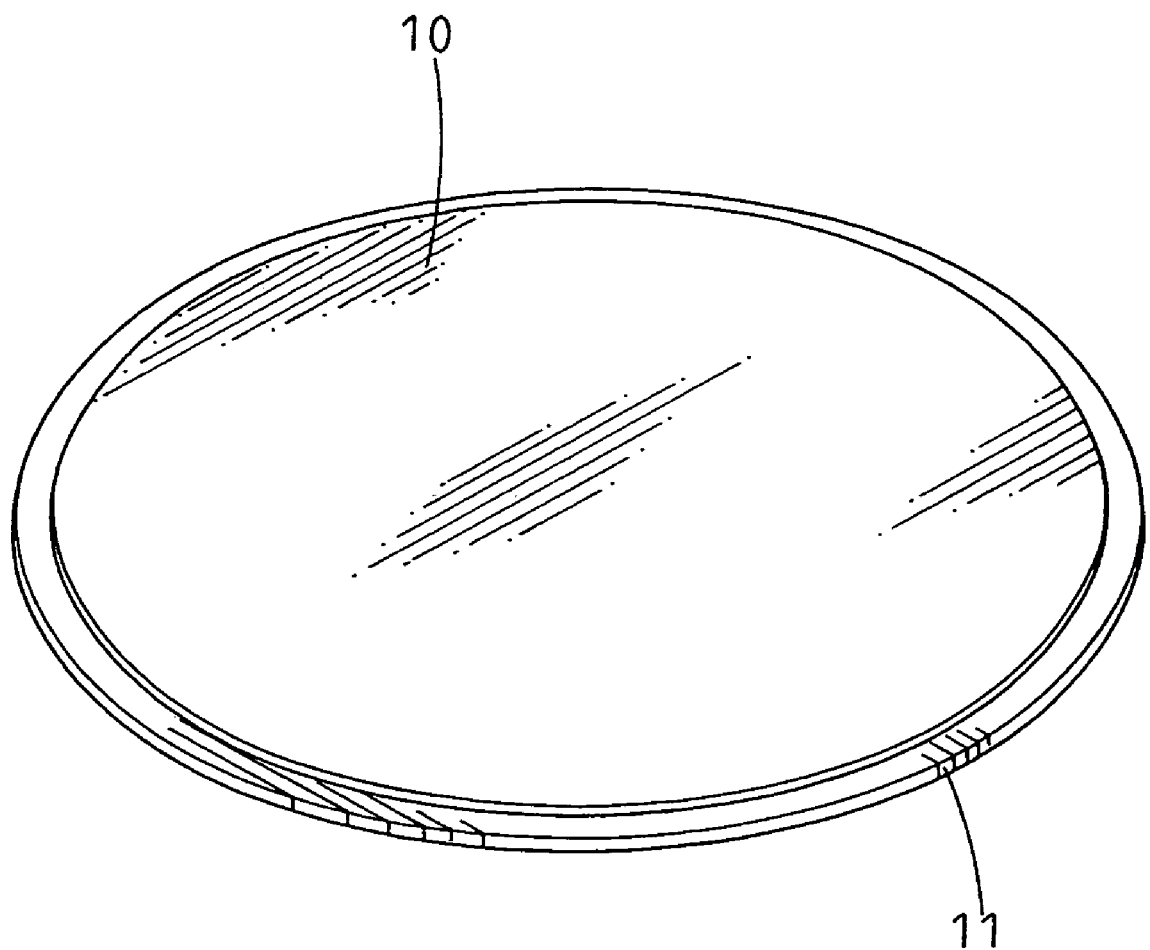
FIG. 2 is a perspective view of a combined chip/heat-dissipating metal plate according to prior art.
Figure 3:
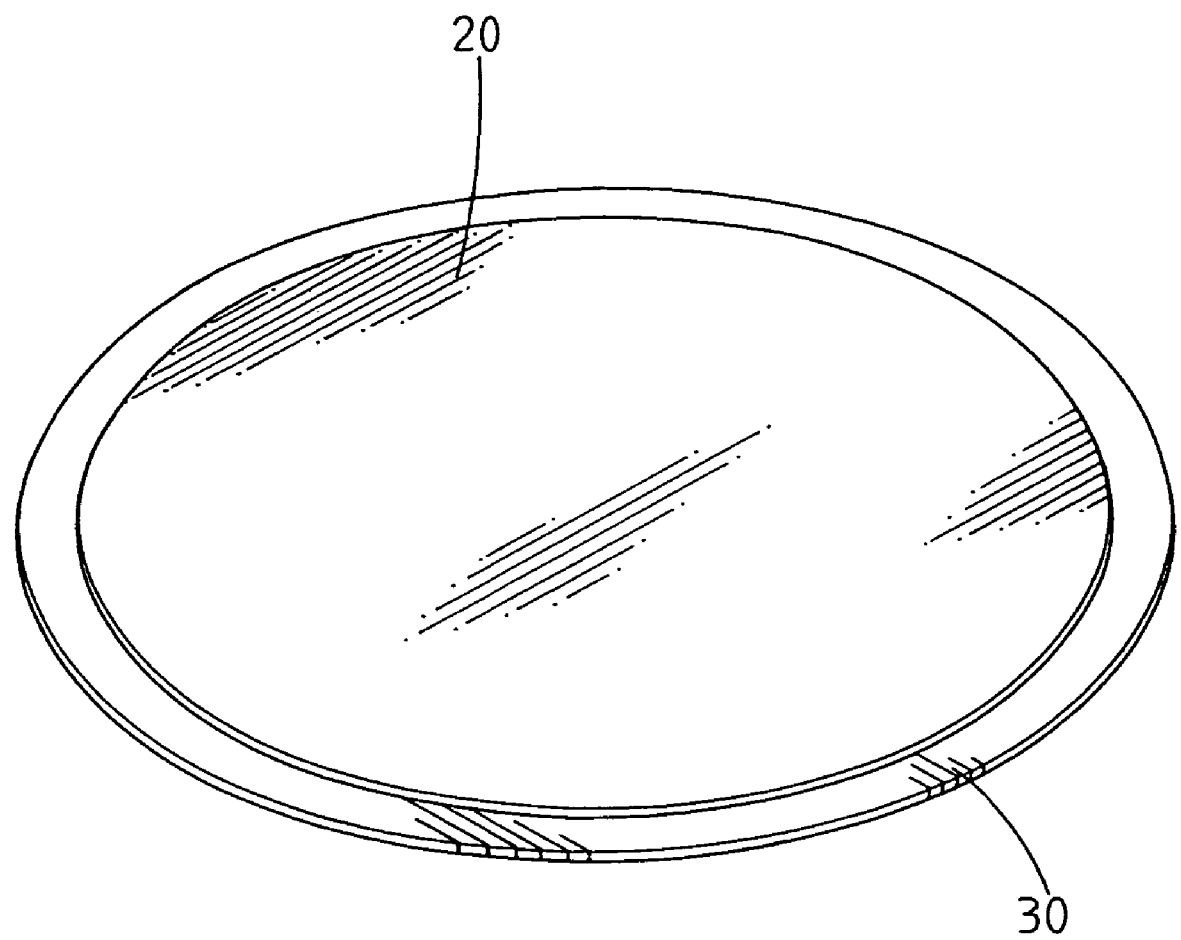
FIG. 3 is a perspective view of a combined chip/heat-dissipating metal plate in accordance with the present invention.

Referring to FIG. 3, a heat-dissipating metal plate 30 is bonded to a side of the chip 20 a chip for high-performance, high-brightness LEDs or high-frequency memories, forming a combined chip/heat-dissipating metal plate in accordance with the present invention. The chip 20 is made of gallium nitride, gallium arsenide, or silicon and has a thickness smaller than 0.1 mm. The heat-dissipating metal plate 30 is made of copper or aluminum and has a thickness smaller than 0.15 mm. A plurality of tiny balls are provided on the side of the chip 20 or adhesive is applied to the side of the chip 20. Next, the chip 20 and the heat-dissipating metal plate 30 are bonded together by applying pressure and heat.

Figure 4:
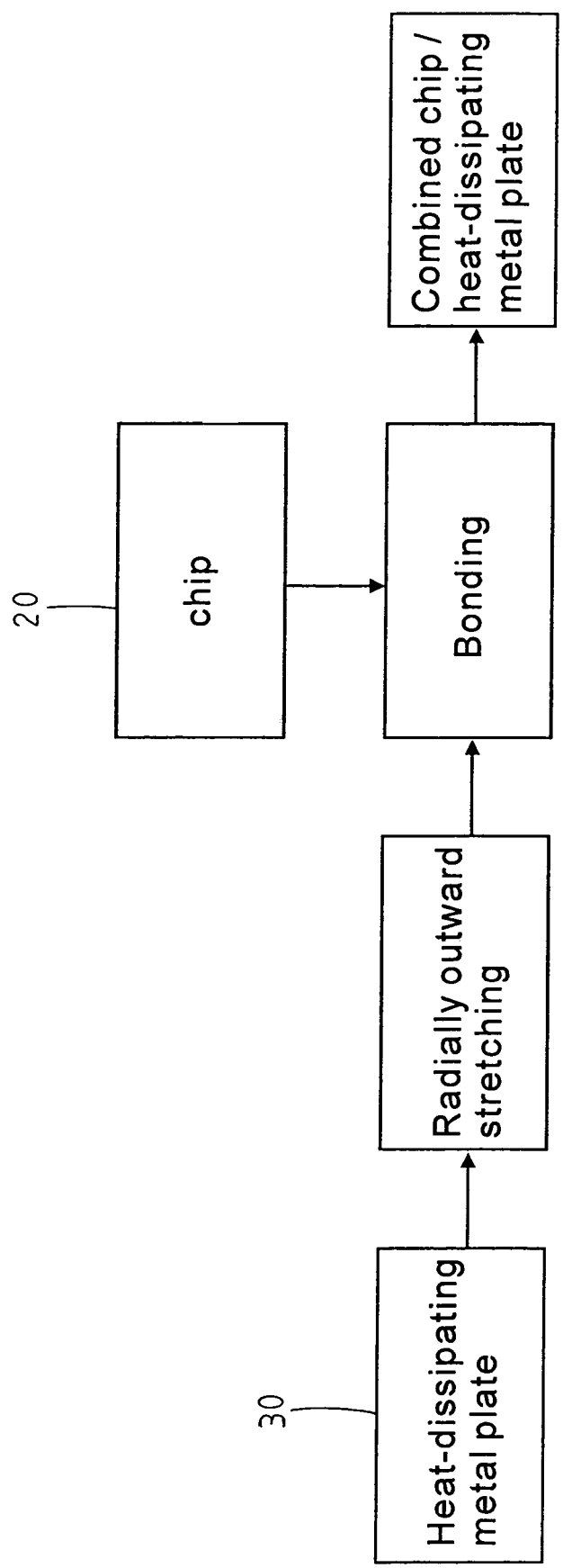
FIG. 4 is a schematic block diagram illustrating a method for manufacturing the combined chip/heat-dissipating metal plate in accordance with the present invention.
Figure 5:
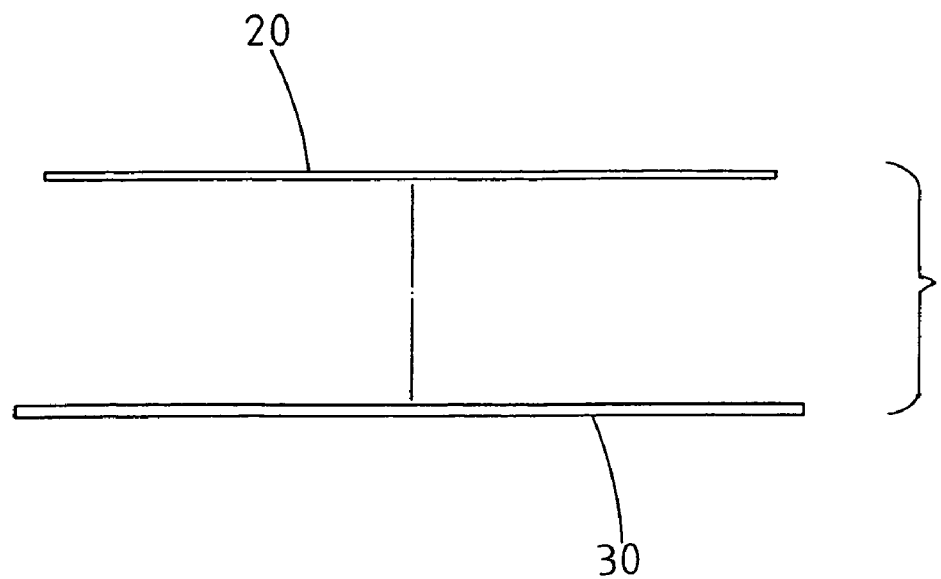
FIG. 5 is an exploded side view illustrating the chip and the heat-dissipating metal plate before bonding.

It is noted that the heat-dissipating metal plate 30 is stretched before bonding with the chip 20. FIG. 4 illustrates a schematic block diagram illustrating a method for manufacturing the combined chip/heat-dissipating metal plate in accordance with the present invention. FIG. 5 is a side view illustrating the chip 20 and the heat-dissipating metal plate 30 before stretching.

Figure 6:
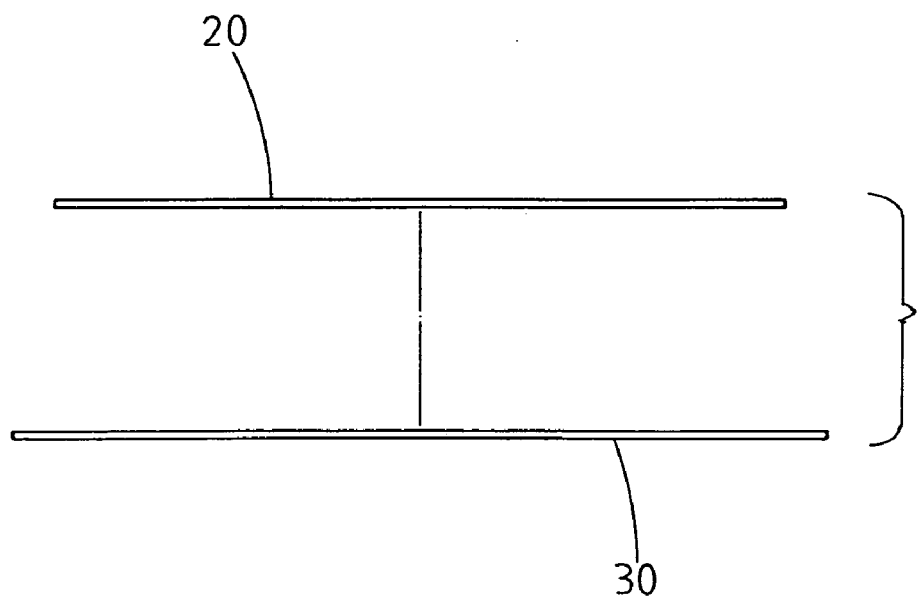
FIG. 6 is a view similar to FIG. 5, wherein the heat-dissipating metal plate is stretched.
Figure 7:
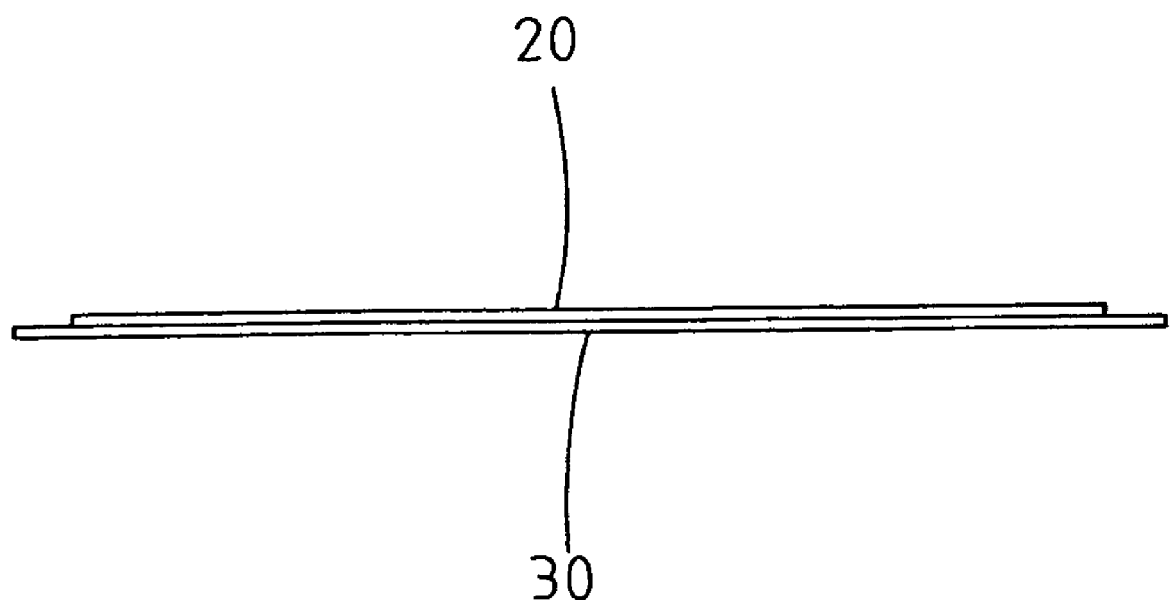
FIG. 7 is a side view of the chip and the heat-dissipating metal plate after bonding.

The heat-dissipating metal plate 3 is stretched radially outward such that the thickness of the heat-dissipating metal plate 3 reduces, as shown in FIG. 6. Preferably, the thickness of the heat-dissipating metal plate 3 reduces by not more than 20% after the stretching step. Then, the chip 20 and the stretched heat-dissipating metal plate 30 are bonded together and take shape by applying heat and pressure, as shown in FIG. 7. As mentioned above, a plurality of tiny balls are provided on the side of the chip 20 or adhesive is applied to the side of the chip 20 for this bonding procedure.

In the combined chip/heat-dissipating metal plate, the chip 20 has good compression strength in the radial direction and the heat-dissipating metal plate 30 has higher tensile strength after being stretched and taking shape, providing a more stable structure and avoiding damage to the chip 20 due to radially outward tension. The combined chip/heat-dissipating metal plate thus obtained is more stable and thus benefits the subsequent cutting by a laser cutting apparatus.

Figure 8:
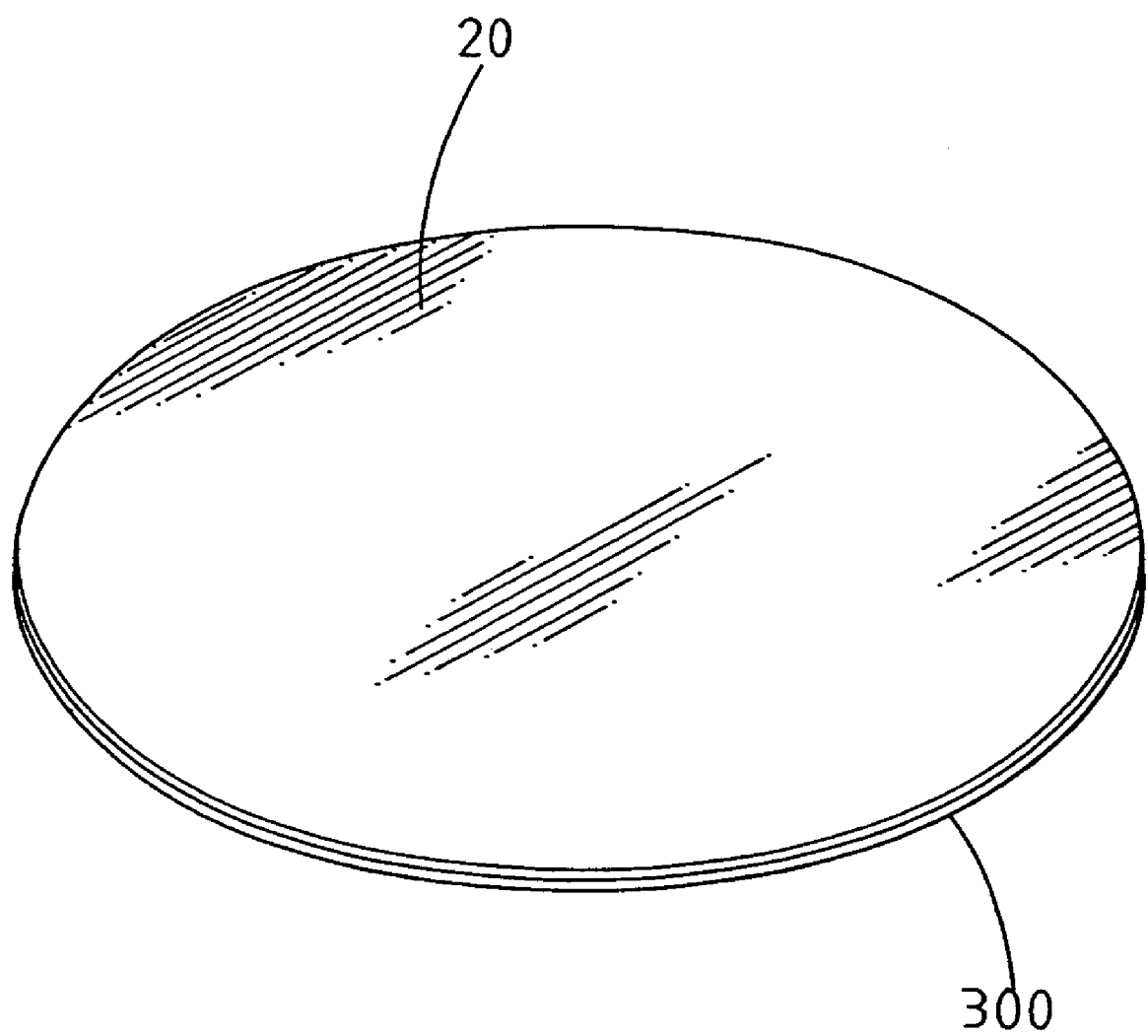
FIG. 8 is a perspective view illustrating a modified embodiment of the combined chip/heat-dissipating metal plate.

The heat-dissipating metal plate 30 in FIG. 7 has a diameter greater than that of the chip 20. Alternatively, the heat-dissipating metal plate 30 can be cut to have a diameter the same as that of the chip 20, as shown in FIG. 8.

Although specific embodiments have been illustrated and described, numerous modifications and variations are still possible without departing from the essence of the invention. The scope of the invention is limited by the accompanying claims.

What is claimed is:

1. A method for manufacturing a combined chip/heat-dissipating metal plate, comprising:

stretching a heat-dissipating metal plate along a radially outward direction of the heat-dissipating metal plate; and bonding a chip to a side of the heat-dissipating metal plate in a stretched state, forming a combined chip/heat-dissipating metal plate with the heat-dissipating metal plate in the stretched state.

2. The method as claimed in claim 1 wherein the stretched heat-dissipating metal plate has a thickness smaller than that of the heat-dissipating metal plate before stretching by not more than 20%.

* * * * *